(12) United States Patent
Shimatou

(10) Patent No.: US 8,872,245 B2
(45) Date of Patent: Oct. 28, 2014

(54) SEMICONDUCTOR DEVICE

(71) Applicant: Fuji Electric Co., Ltd., Kawasaki (JP)

(72) Inventor: Takayuki Shimatou, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 14/107,858

(22) Filed: Dec. 16, 2013

(65) Prior Publication Data

US 2014/0197476 A1    Jul. 17, 2014

(30) Foreign Application Priority Data

Jan. 17, 2013    (JP) .................................. 2013-006170

(51) Int. Cl.
*H01L 29/76*    (2006.01)
*H01L 29/06*    (2006.01)
*H01L 29/78*    (2006.01)
*H01L 29/40*    (2006.01)

(52) U.S. Cl.
CPC ........ *H01L 29/0634* (2013.01); *H01L 29/0638* (2013.01); *H01L 29/0619* (2013.01); *H01L 29/7811* (2013.01); *H01L 29/402* (2013.01)
USPC ........................................................ 257/288

(58) Field of Classification Search
USPC ............. 257/288, 77, 76, 330, 331, 332, 333, 257/347, 367, 409, 488, 493; 438/140, 454, 438/623, 624, 625, 627, 629, 634, 637, 638, 438/678, 687, 688, 690, 734, 738, 740
See application file for complete search history.

(56) References Cited

U.S. PATENT DOCUMENTS

| | | | |
|---|---|---|---|
| 6,380,076 B2 | 4/2002 | Kirchhoff | |
| RE41,866 E * | 10/2010 | Yano et al. | 257/139 |
| 8,344,457 B2 * | 1/2013 | Noguchi et al. | 257/355 |
| 2011/0233714 A1 | 9/2011 | Lu | |

FOREIGN PATENT DOCUMENTS

| | | |
|---|---|---|
| JP | 2001230505 A | 8/2001 |
| JP | 2008227236 A | 9/2008 |
| JP | 2010161240 A | 7/2010 |
| JP | 2011204710 A | 10/2011 |

* cited by examiner

*Primary Examiner* — Yu-Hsi D Sun
*Assistant Examiner* — Wasiul Haider
(74) *Attorney, Agent, or Firm* — Rossi, Kimms & McDowell LLP

(57) ABSTRACT

A semiconductor device includes element active portion X and element peripheral portion Y. An interlayer insulating film is formed on upper surfaces of portions X and Y. A source electrode connected to a p base region and n-type source region and a gate metal wiring formed annularly surrounding the source electrode are formed on element active portion X side upper surface of the interlayer insulating film. The gate metal wiring connects to a gate electrode. An organic protective film with openings is formed on a first main surface side upper surface of the semiconductor substrate, and the openings serve as a gate electrode pad partially exposing the gate metal wiring and a source electrode pad partially exposing the source electrode. An inorganic protective film formed between the gate metal wiring and the organic protective film covers the gate metal wiring. The semiconductor device is highly reliable.

10 Claims, 14 Drawing Sheets

SEMICONDUCTOR DEVICE

BACKGROUND OF THE INVENTION

A. Field of the Invention

The present invention relates to a protective film of a semiconductor device provided with an element active portion and an element peripheral portion.

B. Description of the Related Art

According to a technique as shown in FIG. 14, an inorganic insulating film such as a silicon oxide film or a silicon nitride film is formed as inorganic protective film 10 on gate metal wiring 31, channel stopper electrode 32, source electrode 33 and field plate electrodes 12 which are made of a metal material and which are formed on an upper surface of semiconductor substrate 100. Further, an organic insulating film such as a polybenzoxazole film or a polyimide film is formed as an organic protective film on an upper surface of inorganic protective film 10.

In order to stabilize characteristics of a semiconductor device and improve voltage withstanding thereof, a first insulating layer is formed to lie across an emitter electrode and a gate electrode and a second insulating layer is formed in upper and side surfaces of the first insulating layer. The gate electrode is partially covered with the first insulating layer (for example, see JP-A-2010-161240).

In JP-A-2008-227236, a guard ring electrode and a source electrode in a termination region of a semiconductor element are covered with a protective film made of silicon nitride or polyimide, or the like, in order to reduce the influence of external charges.

In JP-A-2011-204710, field plate electrodes in a termination region of a semiconductor element are covered with a separation oxide film or an interlayer insulating film in order to reduce the influence of external charges and increase the withstand voltage in an element peripheral portion.

In JP-A-2001-230505, a plurality of dielectric layers made of an inorganic material and an organic material are superimposed on one another as a passivation layer on a conductive layer so that the time for a dry etching step for opening the passivation layer is shortened and mechanical stress applied to a silicon nitride layer is relaxed.

In JP-A-8-293492, a polyimide film is formed as a passivation film on a silicon nitride film and ashing is performed on a surface of the polyimide film in order to prevent corrosion of a metal wiring portion exposed in an opening portion of the passivation film and improve the adhesion between polyimide and a mold resin.

The protective film according to the background-art technique shown in FIG. 14 has a double-layer structure in which the inorganic protective film is formed on the surface of semiconductor substrate 100 and the organic protective film is formed thereon. The protective film is formed in order to prevent entry of ions in a mold resin and moisture from the outside in addition to protection against foreign matters on the surface of an element peripheral portion Y of the semiconductor device or against a filler attack caused by a filler in the mold resin. This protective film plays a role of keeping an electric field distribution of the element peripheral portion Y and preventing withstand voltage deterioration.

However, there may be a case where cracks occur in the inorganic protective film in the element peripheral portion Y due to the stress applied to the semiconductor device in a fabricating step. When cracks occur in the inorganic protective film in the element peripheral portion Y, an electric field is locally concentrated in the place where the cracks have occurred in a reliability test in a high temperature and high humidity atmosphere such as a THB test (Temperature, Humidity, Bias Test) so that local decrease in the withstand voltage between a drain electrode and a source electrode occurs and leak failure occurs.

In addition, when the inorganic protective film which may cause occurrence of cracks is not formed, and only the organic protective film is formed, occurrence of cracks can be prevented. However, leak failure occurs between the gate electrode and the source electrode because moisture and ions in the mold resin enter into an interface between the protective film and the metal wiring and an interface between the protective film and a metal electrode in a reliability test in a high temperature and high humidity atmosphere such as a THB test. In addition, leak failure occurs between the gate electrode and the drain electrode when a ground voltage is applied to the source electrode and a negative voltage is applied to the drain voltage.

SUMMARY OF THE INVENTION

The present invention provides a semiconductor device with high reliability, which overcomes or at least reduces the effects of one or more of the problems set forth above. P base region 14 and n-type source region 16 are formed in first conductive type drift region 15 of semiconductor substrate 100 in element active portion X. Gate electrode 5 is formed on an upper surface of semiconductor substrate 100 in the element active portion X side through gate insulating film 4.

At least two guard rings 11 are formed in first conductive type drift region 15 of semiconductor substrate 100 in element peripheral portion Y and p-type surface region 13 is formed annularly in an outermost periphery of semiconductor substrate 100. In addition, insulating film 7 is formed on the upper surface of semiconductor substrate 100 in element peripheral portion Y side.

Further, interlayer insulating film 6 is formed on the upper surface in both element active portion X and element peripheral portion Y. Source electrode 33 connected to p base region 14 and n-type source region 16, and gate metal wiring 31 formed annularly to surround source electrode 33 are formed on an upper surface of interlayer insulating film 6 on element active portion X side. Gate metal wiring 31 is connected to gate electrode 5.

At least one annular field plate electrode 12 and annular channel stopper electrode 32 are formed on the upper surface of interlayer insulating film 6 on element peripheral portion Y side. Field plate electrode 12 is connected to guard rings 11. In addition, channel stopper electrode 32 is connected to p-type surface region 13.

Organic protective film 2 provided with opening portions is formed on the upper surface of semiconductor substrate 100 in a first main surface side. The opening portions serve as gate electrode pad 41 partially exposing gate metal wiring 31 and source electrode pad 42 partially exposing source electrode 33. Inorganic protective film 1 is formed between gate metal wiring 31 and organic protective film 2 so that gate metal wiring 31 is covered with inorganic protective film 1.

According to the invention, it is possible to provide a semiconductor device with high reliability.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Description will be made below in conjunction with embodiments of the invention.

An MOSFET (Metal Oxide Semiconductor Field Effect Transistor) will be mainly described as the semiconductor device in each of the following embodiments. The invention is not limited to the MOSFET, but also may be, for example, as an IGBT (Insulated Gate Bipolar Transistor).

In addition, the following embodiments may be carried out in combination. The invention is not limited to those embodiments.

Embodiment 1

Figure 1:
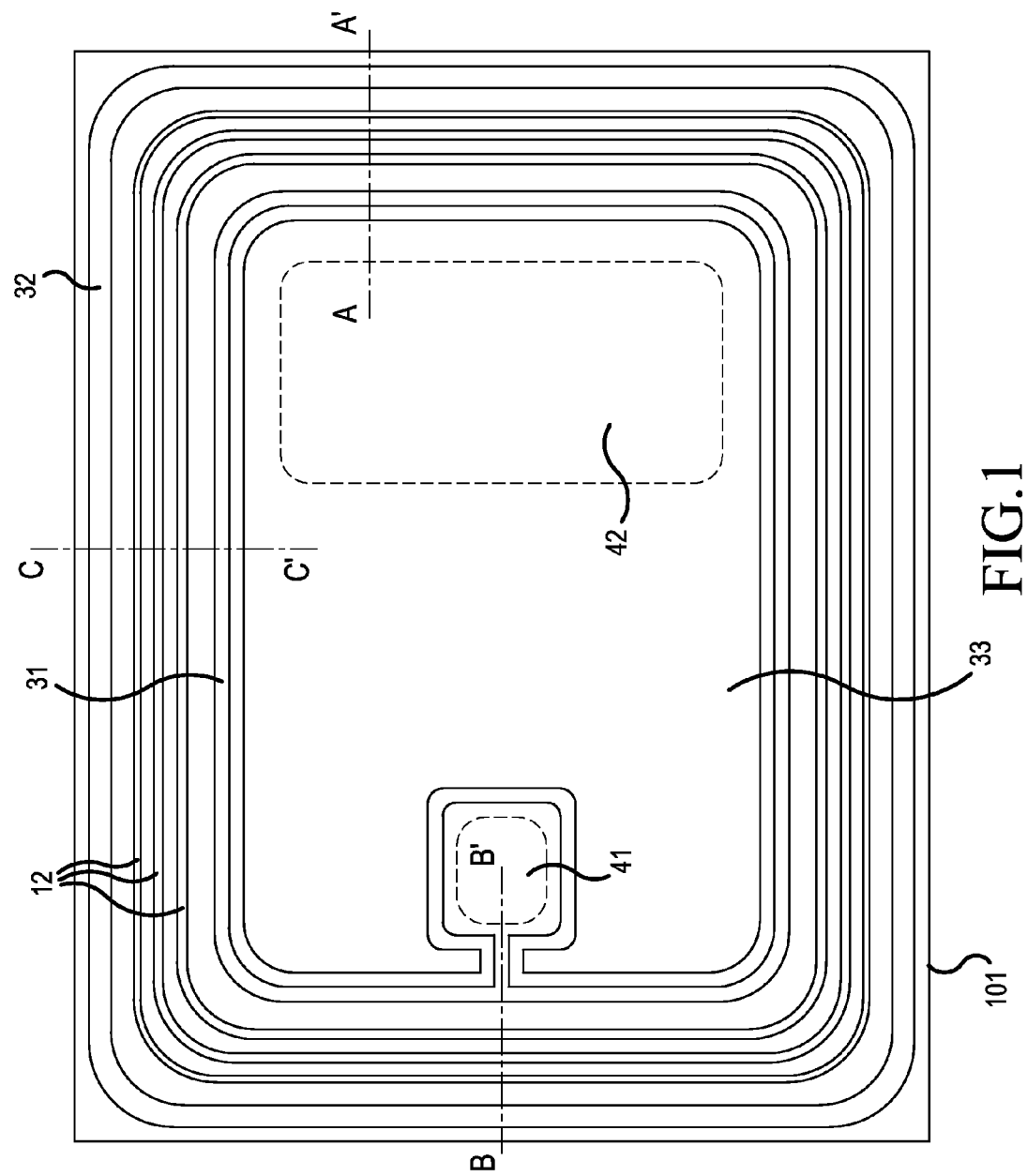
FIG. 1 is a plan view showing Embodiment 1 of the invention.
Figure 2:
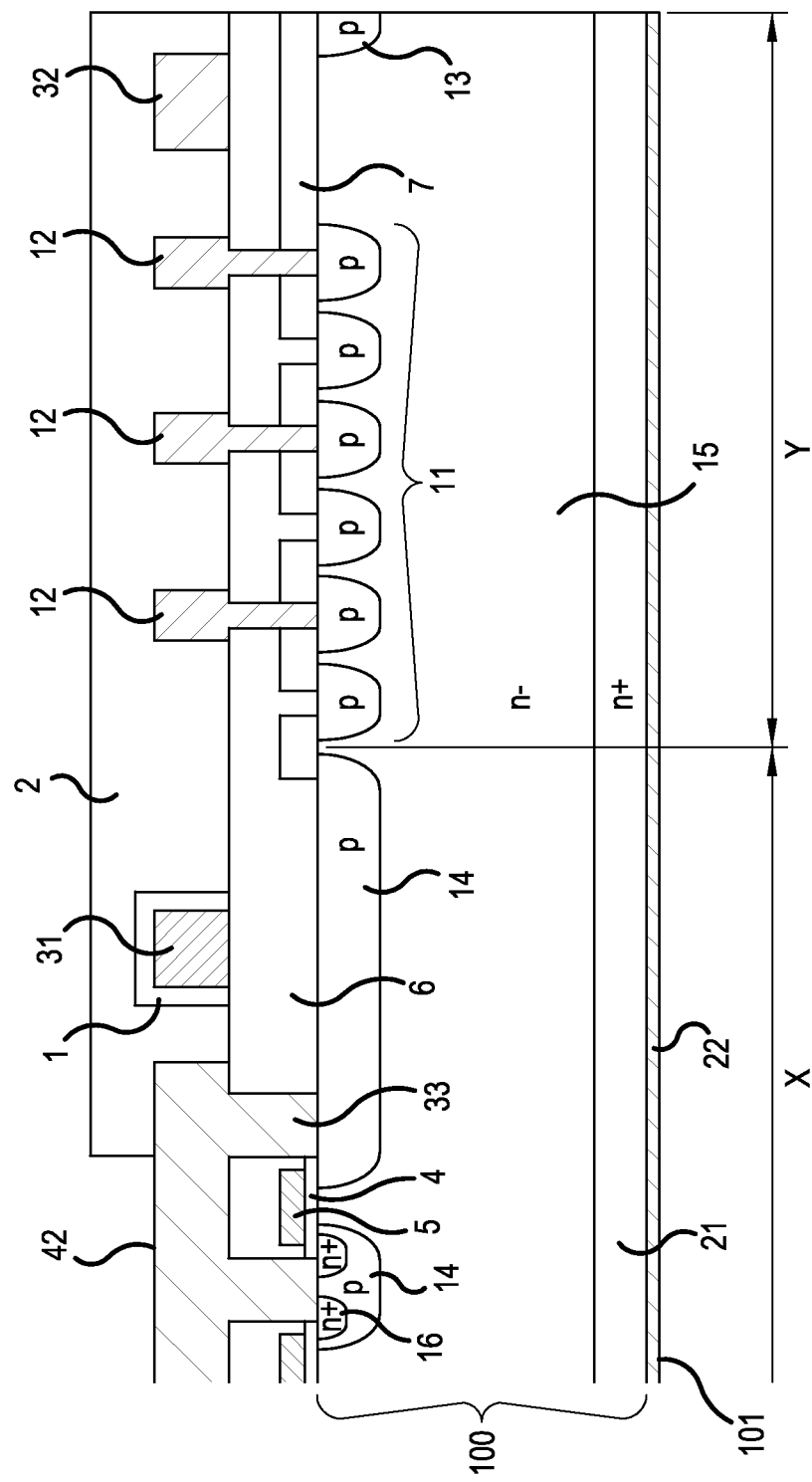
FIG. 2 is a sectional view of Embodiment 1 of the invention taken along the line A-A' in FIG. 1.
Figure 3:
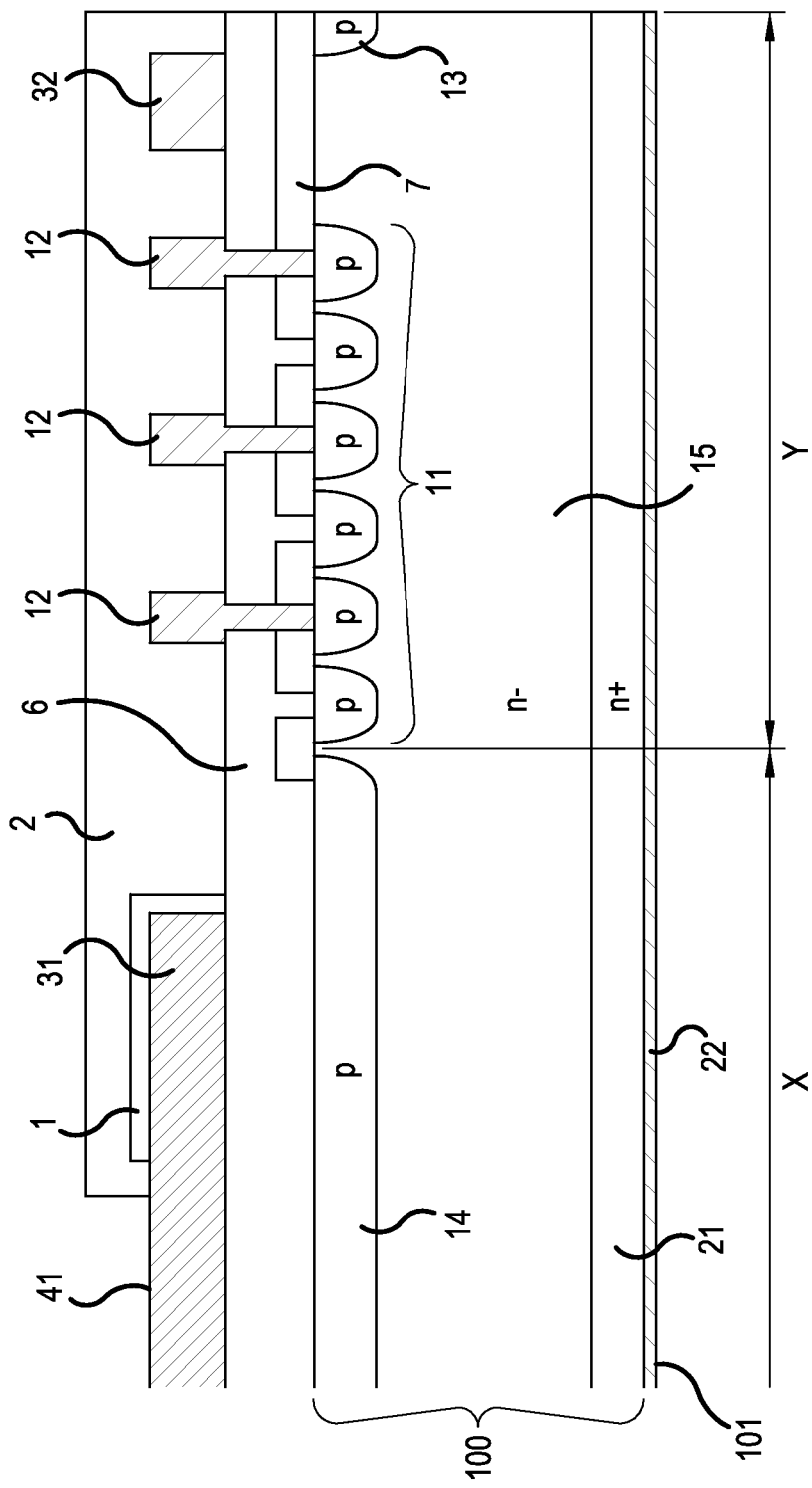
FIG. 3 is a sectional view of Embodiment 1 of the invention taken along the line B-B' in FIG. 1.
Figure 4:
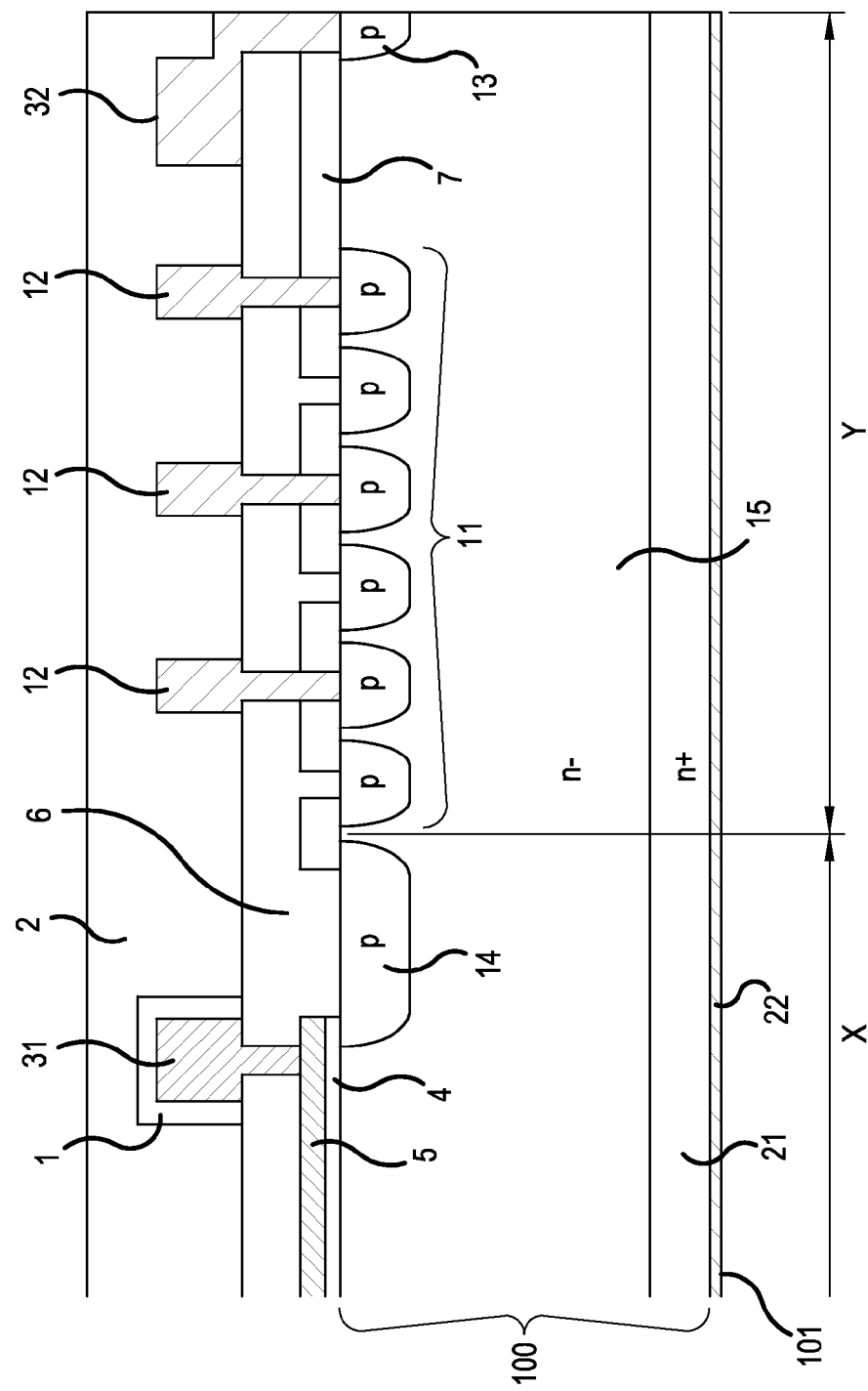
FIG. 4 is a sectional view of Embodiment 1 of the invention taken along the line C-C' in FIG. 1.

FIG. 1, FIG. 2, FIG. 3 and FIG. 4 are configuration views of a first embodiment of the invention. FIG. 1 is a plan view of Embodiment 1 of the invention, showing the case where organic protective film 2 has not been formed. FIG. 2 is a sectional view taken along line A-A' in FIG. 1 in the case where organic protective film 2 has been formed. FIG. 3 is a sectional view taken along line B-B' in FIG. 1 in the case where organic protective film 2 has been formed. FIG. 4 is a sectional view taken along the line C-C' in FIG. 1 in the case where organic protective film 2 has been formed.

As shown in FIG. 1, semiconductor device 101 has source electrode pad 42 which is formed in a part of source electrode 33, and gate electrode pad 41 which is formed as a part which sticks out of annular gate metal wiring 31. Gate metal wiring 31 is formed to surround source electrode 33. In source electrode pad 42 and gate electrode pad 41, the surface of source electrode 33 and the surface of gate metal wiring 31 are exposed. Field plate electrodes 12 and channel stopper electrode 32 are annularly formed in element peripheral portion Y, in a more outer periphery than gate metal wiring 31.

As shown in FIG. 2, p base region 14 is formed in first conductive type drift region 15 in a first main surface of semiconductor substrate 100 in element active portion X, and n-type source region 16 is formed in p base region 14. Gate electrode 5 is formed on the surface of p base region 14 between drift region 15 and n-type source region 16 through gate insulating film 4.

At least two guard rings 11 are formed in first conductive type drift region 15 in the first main surface of semiconductor substrate 100 in element peripheral portion Y and p-type surface region 13 is formed in an outermost periphery of semiconductor substrate 100. In addition, insulating film 7 is formed on the first main surface side upper surface of semiconductor substrate 100 on element peripheral portion Y side.

Further, interlayer insulating film 6 is formed on the first main surface side upper surface of semiconductor substrate 100. Gate metal wiring 31 and source electrode 33 are formed on the upper surface of interlayer insulating film 6 on the side of element active portion X. Gate metal wiring 31 is connected to gate electrode 5, as shown in FIG. 4. The source electrode is connected to p base region 14 and n-type source region 16, as shown in FIG. 2.

One or more field plate electrodes 12 and a channel stopper electrode 32 are formed on the upper surface of the interlayer insulating film 6 on the side of the element peripheral portion Y. The field plate electrodes 12 are connected to the guard rings 11. On the other hand, channel stopper electrode 32 is connected to p-type surface region 13.

Incidentally, the place where channel stopper electrode 32 and p-type surface region 13 are connected to each other is not limited to the position of the section taken along line C-C' shown in FIG. 1, but may be any place in element peripheral portion Y.

In addition, p-type surface region 13 may be of an n type instead. Channel stopper electrode 32 may be electrically connected to drift region 15.

Gate metal wiring 31 is formed so as to be covered with inorganic protective film 1. As shown in FIG. 2 and FIG. 3, organic protective film 2 is formed on the first main surface side upper surface of semiconductor substrate 100 except a part of gate metal wiring 31 and a part of source electrode 33. Gate metal wiring 31 and source electrode 33 whose surfaces are exposed because organic protective film 2 is not formed thereon serve as gate electrode pad 41 and source electrode pad 42.

Drain region 21 is formed on the side of a second main surface of semiconductor substrate 100. Drain electrode 22 is formed on the upper surface of drain region 21.

Gate metal wiring 31, channel stopper electrode 32, source electrode 33, source electrode pad 42 and field plate electrodes 12 are made of a metal material, preferably made of an alloy containing aluminum such as Al—Si or Al—Si—Cu with good conductivity.

Inorganic protective film 1 is of a silicon oxide film or a silicon nitride film having good adhesion to the metal material. Inorganic protective film 1 is formed to be thick enough to cover an electrode made of the metal material for gate metal wiring 31, channel stopper electrode 32, source electrode 33, source electrode pad 42 and field plate electrodes 12. Therefore, when, for example, the electrode made of the metal material is 3 to 5 μm thick, it is preferable that inorganic protective film 1 is formed to be about 0.5 to 1.0 μm thick.

Organic protective film 2 is formed on the first main surface side upper surface of semiconductor substrate 100 in order to protect semiconductor device 101 from foreign matter or attack by fillers in a mold resin. Therefore, it is preferable that organic protective film 2 is made of polybenzoxazole or polyimide.

Insulating film 7 is of a silicon oxide film which is formed by thermal oxidation. Interlayer insulating film 6 is made of a BPSG (Boron Phosphorus Silicon Glass) film formed by a CVD (Chemical Vapor Deposition) method. However, interlayer insulating film 6 is not limited to this but may be a silicon oxide film, a silicon nitride film or a laminated film of these films.

Gate metal wiring 31, gate electrode pad 41, source electrode 33, source electrode pad 42, field plate electrodes 12, and channel stopper electrode 32 are formed in such a manner that a metal material film is formed on the whole of the first main surface of semiconductor substrate 100 by sputtering, patterned with a resist, and then dry-etched or wet-etched so as to be removed except gate metal wiring 31, gate electrode pad 41, source electrode 33, source electrode pad 42, field plate electrodes 12, and channel stopper electrode 32, and the resist is removed.

Inorganic protective film 1 is formed in such a manner that an inorganic protective film is formed on the whole of the first main surface of semiconductor substrate 100 by the CVD method, patterned with a resist and then dry-etched so as to be removed except side and upper surfaces of gate metal wiring 31. After the resist is removed, organic protective film 2 is formed on the whole of the first main surface side upper surface of semiconductor substrate 100 by the CVD method.

Since the side and upper surfaces of gate metal wiring 31 are covered with inorganic protective film 1 having good adhesion to the metal material, separation in an interface between gate metal wiring 31 and inorganic protective film 1 can be suppressed in a reliability test in a high temperature and high humidity atmosphere such as a THB test so that leak failure between gate metal wiring 31 and source electrode 33 can be suppressed. In addition, when a ground voltage is applied to source electrode 33 and a negative voltage is applied to drain electrode 22, leak failure between gate metal wiring 31 and drain electrode 22 can be suppressed.

Figure 14:
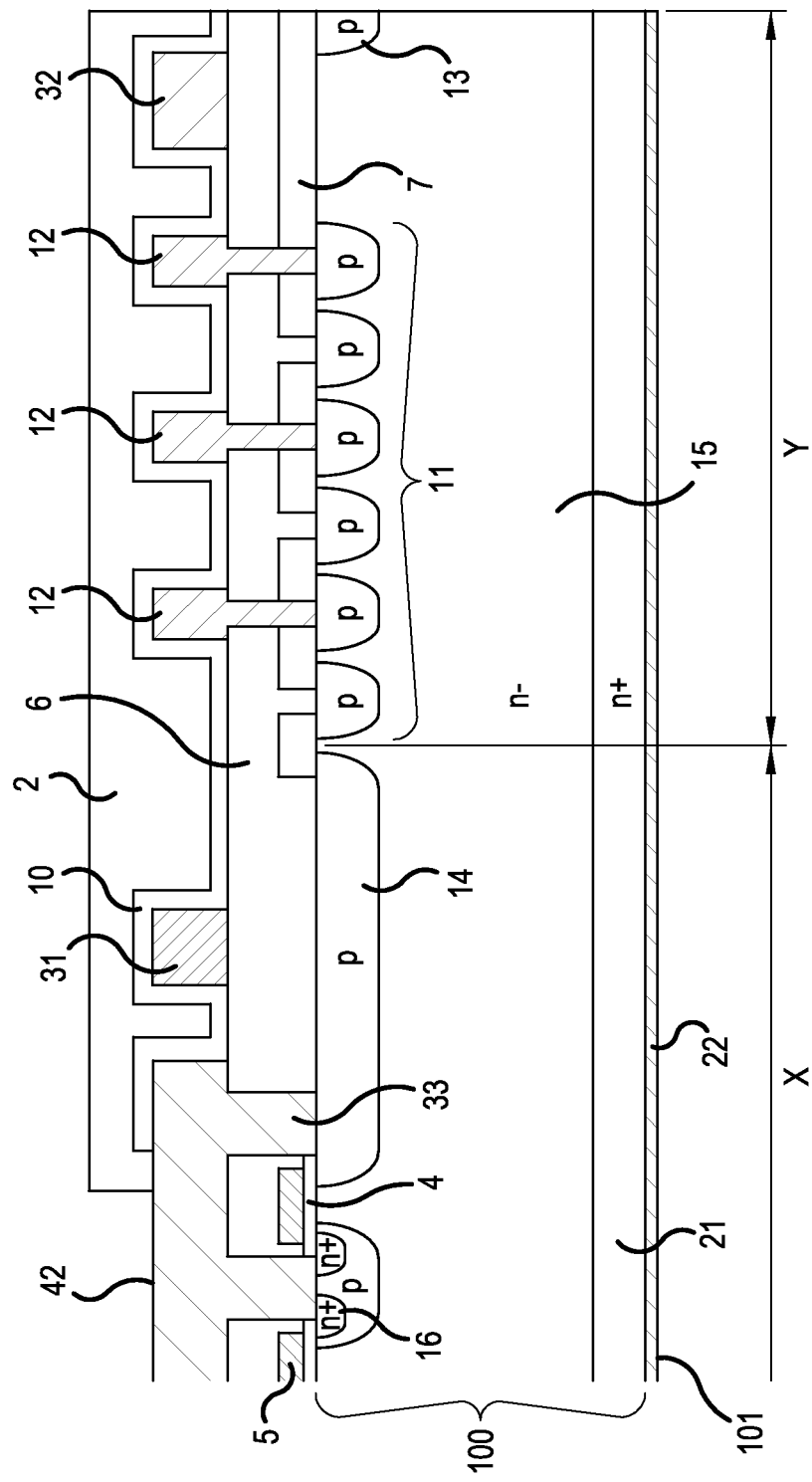
FIG. 14 is a sectional view of a background-art technique taken along the line A-A' in FIG. 1.

Inorganic protective film 1 formed only on the side and upper surfaces of gate metal wiring 31 can prevent cracks which occurred in inorganic protective film 10 in element peripheral portion Y in the technique shown in FIG. 14 due to the stress applied to semiconductor device 101 in a fabricating step. When occurrence of the cracks is prevented, ions in a mold resin and moisture can be prevented from locally entering into a crack occurrence place in a reliability test in a high temperature and high humidity atmosphere such as a THB test so that the withstand voltage can be suppressed from being locally decreased between drain electrode 22 and source electrode 33, and leak failure can be suppressed.

Embodiment 2

Figure 5:
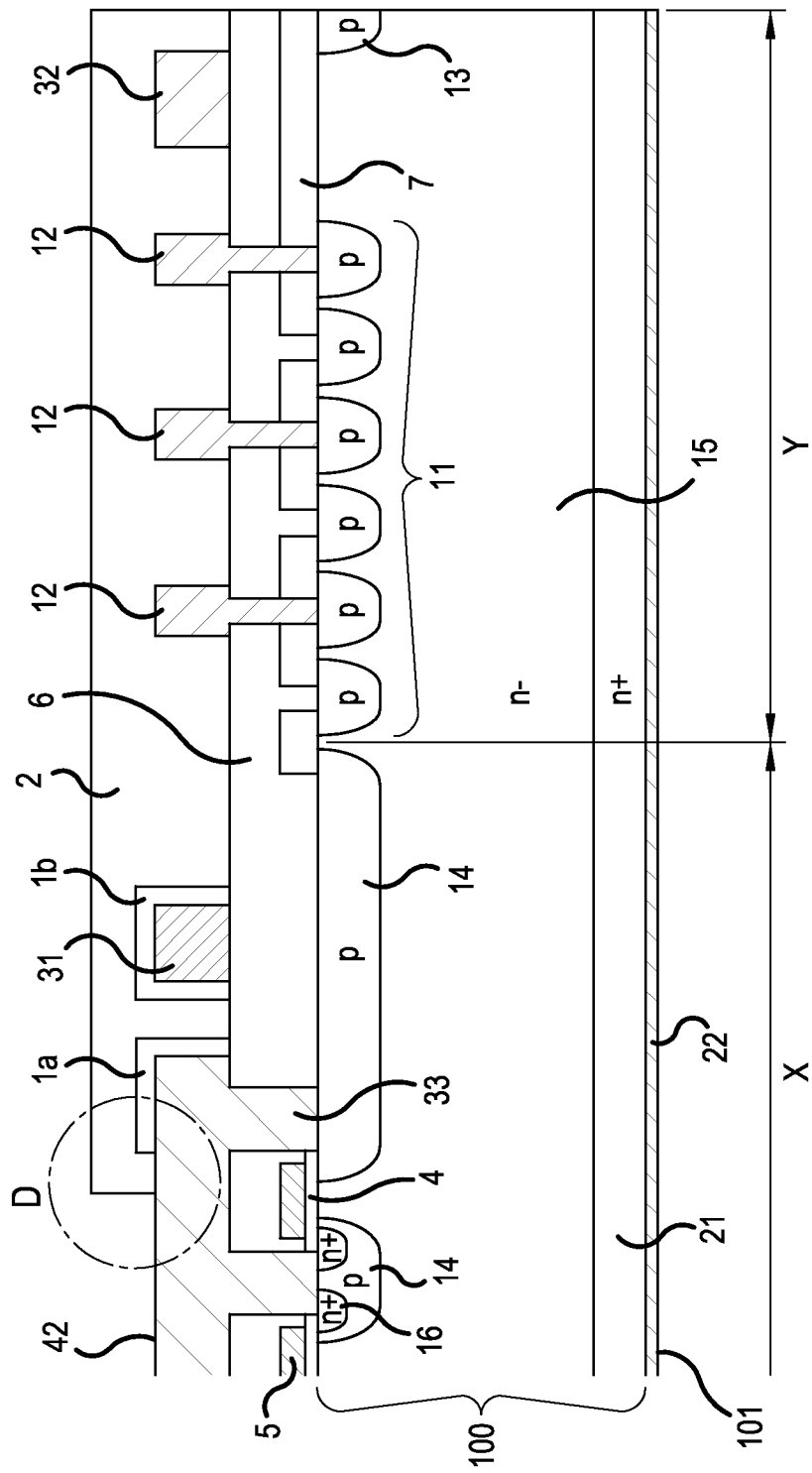
FIG. 5 is a sectional view of Embodiment 2 of the invention taken along the line A-A' in FIG. 1.
Figure 6A:
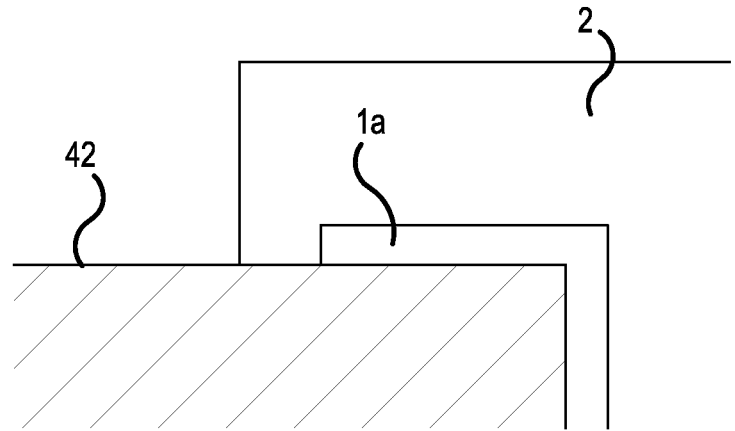
FIGS. 6A and 6B are enlarged views of a portion D in FIG. 5 according to Embodiment 2 of the invention.
Figure 6B:
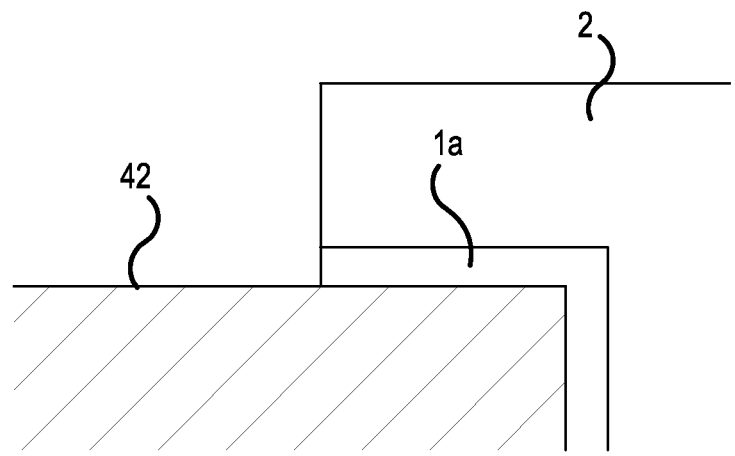

FIG. 5 and FIGS. 6A and 6B are configuration views of a second embodiment of the invention. FIG. 5 is a sectional view taken along line A-A' in FIG. 1. FIGS. 6A and 6B are enlarged views of portion D in FIG. 5.

The different point from the first embodiment is that inorganic protective film 1a is further provided between source electrode 33 and organic protective film 2. The remaining configuration is the same as that in the first embodiment.

As shown in FIG. 5, inorganic protective film 1a is formed on the upper and side surfaces of source electrode 33, and inorganic protective film 1b is formed to cover the upper and side surfaces of gate metal wiring 31. Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Incidentally, although an end portion of inorganic protective film 1a and an end portion of organic protective film 2 in source electrode pad 42 are formed so that organic protective film 2 is formed to cover an end surface of inorganic protective film 1 as shown in FIG. 6A, they may be formed so that an end surface of inorganic protective film 1a and an end surface of organic protective film 2 are put in plane with each other as shown in FIG. 6B. In addition, gate electrode pad 41 can be also formed in a similar manner.

Inorganic protective films 1a and 1b are of a silicon oxide film or a silicon nitride film having good adhesion to the metal material. Inorganic protective films 1a and 1b are formed to be thick enough to cover electrodes made of the metal material for gate metal wiring 31, channel stopper electrode 32, source electrode 33, source electrode pad 42 and field plate electrodes 12. Therefore, when, for example, the electrodes made of the metal material are 3 to 5 µm thick, it is preferable that inorganic protective films 1a and 1b are formed to be about 0.5 to 1.0 µm thick.

Inorganic protective films 1a and 1b are formed in such a manner that an inorganic protective film is formed on the whole of the first main surface of semiconductor substrate 100 by a CVD method, patterned with a resist and then dry-etched so as to be removed except the side and upper surfaces of gate metal wiring 31 and the side surface and upper surfaces of source electrode 33.

Since the side and upper surfaces of gate metal wiring 31 are covered with inorganic protective film 1b having good adhesion to the metal material, separation in an interface between gate metal wiring 31 and inorganic protective film 1b can be suppressed in a reliability test in a high temperature and high humidity atmosphere, such as a THB test so that leak failure between gate metal wiring 31 and source electrode 33 can be suppressed. In addition, in the case where a ground voltage is applied to source electrode 33 and a negative voltage is applied to drain electrode 22, leak failure between gate metal wiring 31 and drain electrode 22 can be suppressed.

Since inorganic protective film 1a having good adhesion to the metal material is provided on source electrode 33, entry of ions in a mold resin and moisture from source electrode pad 42 can be suppressed in a reliability test in a high temperature and high humidity atmosphere, such as a THB test. Since entry of ions in the mold resin and moisture from an interface between source electrode 33 and inorganic protective film 1a is prevented, separation in the interface between gate metal wiring 31 and inorganic protective film 1b can be suppressed so that leak failure between gate metal wiring 31 and the source electrode 33 and between gate metal wiring 31 and drain electrode 22 can be suppressed.

Since inorganic protective films 1a and 1b are formed only on the side and upper surfaces of gate metal wiring 31 and the side and upper surfaces of source electrode 33, it is possible to prevent cracks which occurred in inorganic protective film 10 in element peripheral portion Y in the technique shown in FIG. 14 due to the stress applied to semiconductor device 101 in a fabricating step.

Since these cracks are prevented, ions in the mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be prevented.

Embodiment 3

Figure 7:
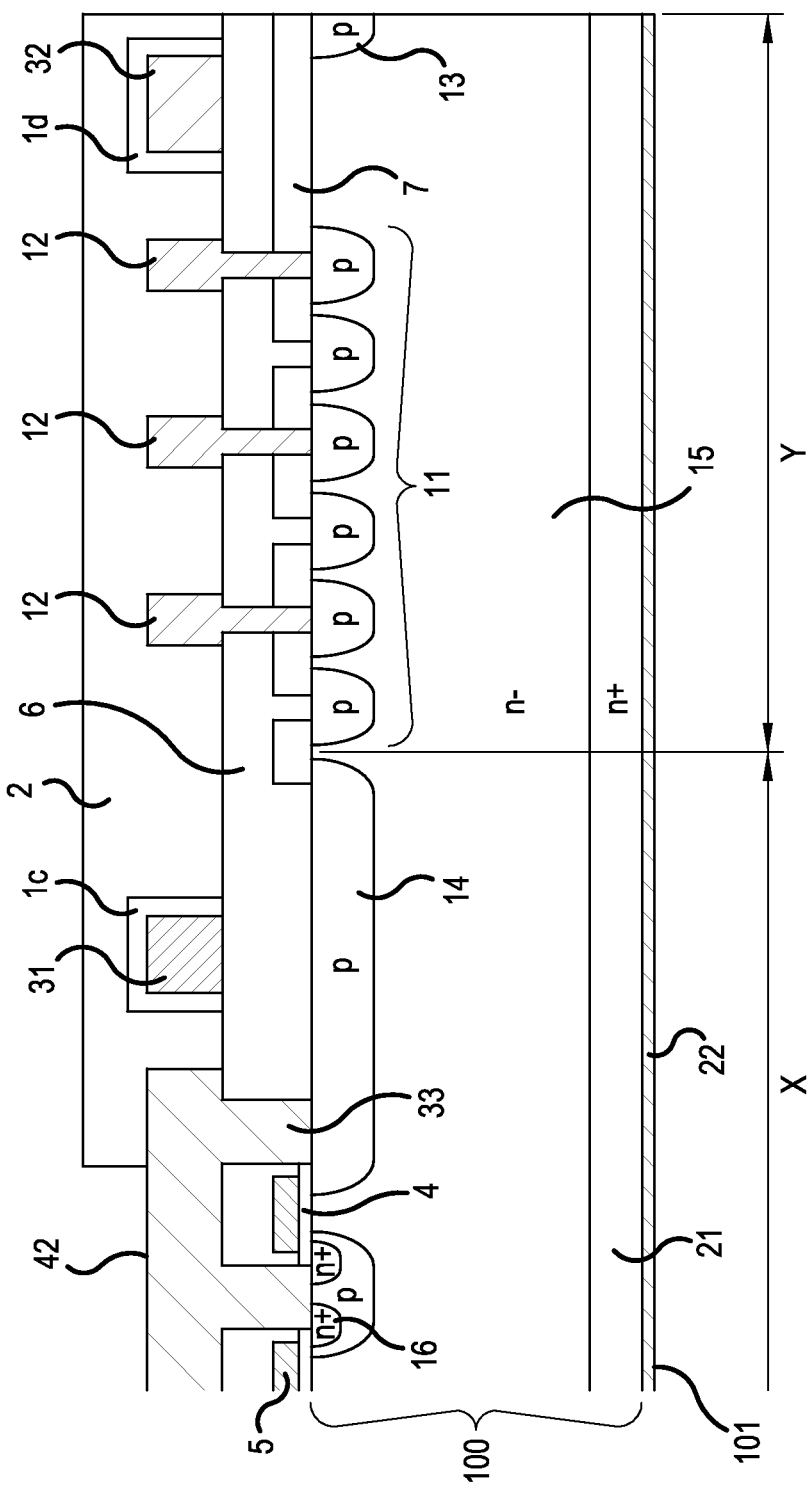
FIG. 7 is a sectional view of Embodiment 3 of the invention taken along the line A-A' in FIG. 1.

FIG. 7 is a configuration view of a third embodiment of the invention, which is a sectional view taken along line A-A' in FIG. 1.

The different point from the first embodiment is that inorganic protective film 1d is further provided between channel stopper electrode 32 and organic protective film 2. The remaining configuration is the same as that in the first embodiment.

As shown in FIG. 7, inorganic protective film 1c is formed so as to cover the side and upper surfaces of gate metal wiring 31, and inorganic protective film 1d is formed on the side and upper surfaces of channel stopper electrode 32.

Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Inorganic protective films 1c and 1d are of a silicon oxide film or a silicon nitride film having good adhesion to the metal material. Inorganic protective films 1c and 1d are formed to be thick enough to cover electrodes made of the metal material for gate metal wiring 31, channel stopper electrode 32, source electrode 33, source electrode pad 42 and field plate electrodes 12. Therefore, when, for example, the electrodes made of the metal material are 3 to 5 μm thick, it is preferable that inorganic protective films 1c and 1d are formed to be about 0.5 to 1.0 μm thick.

Inorganic protective films 1c and 1d are formed in such a manner that an inorganic protective film is formed on the whole of the first main surface of semiconductor substrate 100 by a CVD method, patterned with a resist and then dry-etched so as to be removed except the side and upper surfaces of gate metal wiring 31 and the side surface and upper surfaces of channel stopper electrode 32.

Since gate metal wiring 31 is covered with inorganic protective film 1c having good adhesion to the metal material, separation in an interface between gate metal wiring 31 and inorganic protective film 1c can be suppressed in a reliability test in a high temperature and high humidity atmosphere, such as a THB test so that leak failure between gate metal wiring 31 and source electrode 33 can be suppressed. In addition, when a ground voltage is applied to source electrode 33 and a negative voltage is applied to drain electrode 22, leak failure between gate metal wiring 31 and drain electrode 22 can be suppressed.

In addition, since inorganic protective film 1d is formed on channel stopper electrode 32, entry of ions in a mold resin and moisture from an end surface of element peripheral portion Y can be prevented in a reliability test in a high temperature and high humidity atmosphere, such as a THB test.

Since inorganic protective films 1c and 1d are formed only on the side and upper surfaces of gate metal wiring 31 and the side and upper surfaces of the channel stopper electrode, it is possible to prevent cracks which occurred in inorganic protective film 10 in element peripheral portion Y in the technique shown in FIG. 14 due to the stress applied to semiconductor device 101 in a fabricating step.

Since these cracks are prevented, ions in the mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

Embodiment 4

Figure 8:
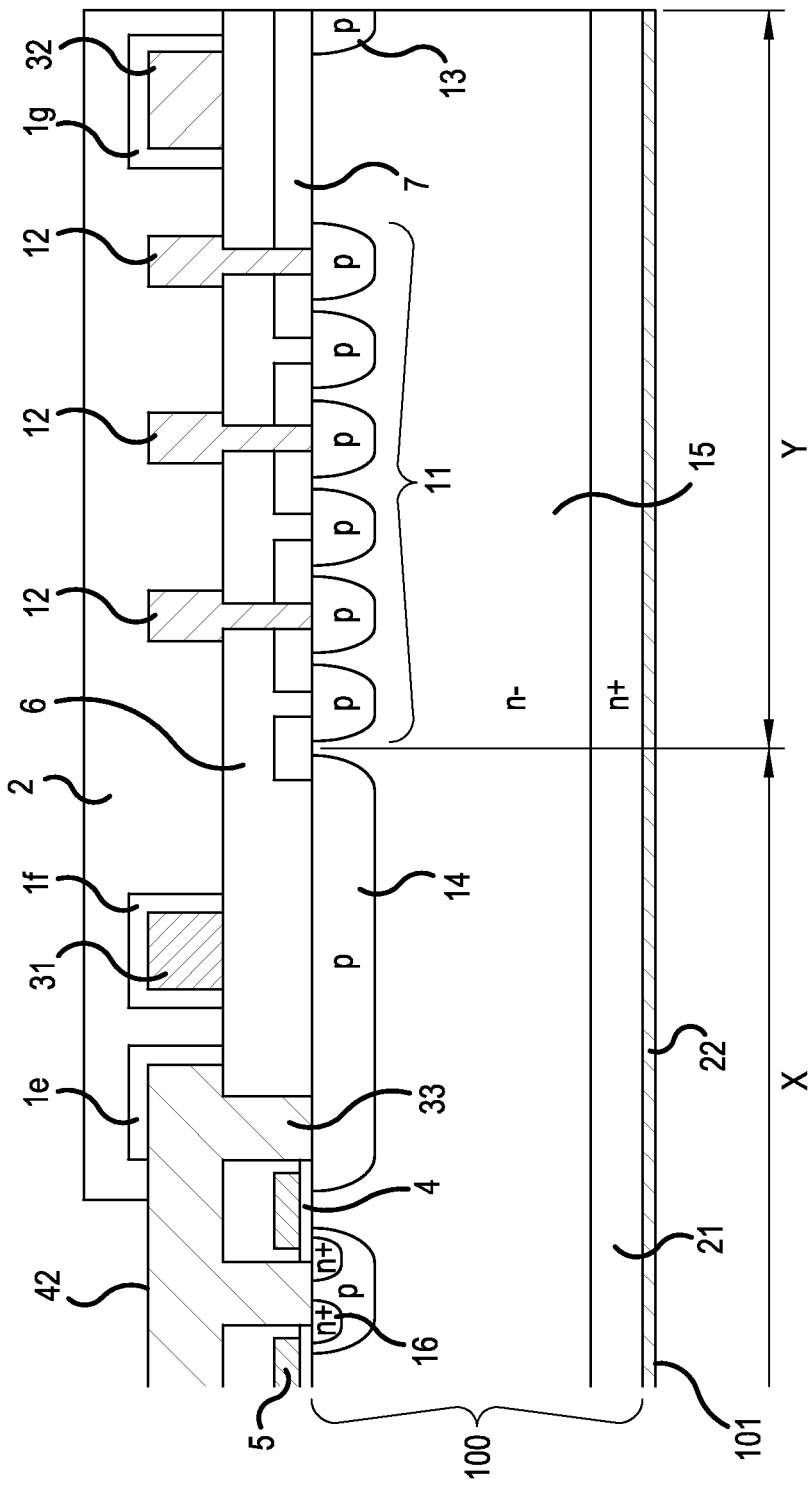
FIG. 8 is a sectional view of Embodiment 4 of the invention taken along the line A-A' in FIG. 1.

FIG. 8 is a configuration view of a fourth embodiment of the invention, which is a sectional view taken along line A-A' in FIG. 1.

The different point from the first embodiment is that an inorganic protective film is further provided between source electrode 33 and organic protective film 2 and between channel stopper electrode 32 and organic protective film 2. The remaining configuration is the same as that in the first embodiment.

As shown in FIG. 8, inorganic protective film 1e is formed on the upper and side surfaces of source electrode 33, inorganic protective film 1f is formed so as to cover the side and upper surfaces of gate metal wiring 31, and inorganic protective film 1g is formed on the side and upper surfaces of channel stopper electrode 32.

Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Incidentally, an end portion of inorganic protective film 1e and an end portion of organic protective film 2 in gate electrode pad 41 and source electrode pad 42 may be formed so that an end surface of inorganic protective film 1e and an end surface of organic protective film 2 are put in plane with each other as shown in FIG. 6B.

Inorganic protective films 1e, 1f and 1g are of a silicon oxide film or a silicon nitride film having good adhesion to the metal material. Inorganic protective films 1e, 1f and 1g are formed to be thick enough to cover electrodes made of the metal material for gate metal wiring 31, channel stopper electrode 32, source electrode 33, source electrode pad 42 and field plate electrodes 12. Therefore, when, for example, the electrodes made of the metal material are 3 to 5 μm thick, it is preferable that inorganic protective films 1e, 1f and 1g are formed to be about 0.5 to 1.0 μm thick.

Inorganic protective films 1e, 1f and 1g are formed in such a manner that an inorganic protective film is formed on the whole of the first main surface of semiconductor substrate 100 by a CVD method, patterned with a resist and then dry-etched so as to be removed except the upper and side surfaces of source electrode 33, the side and upper surfaces of gate metal wiring 31 and the side and upper surfaces of channel stopper electrode 32.

Since gate metal wiring 31 is covered with inorganic protective film 1f having good adhesion to the metal material, separation in an interface between gate metal wiring 31 and inorganic protective film 1f can be suppressed in a reliability test in a high temperature and high humidity atmosphere, such as a THB test so that leak failure between gate metal wiring 31 and source electrode 33 can be suppressed. In addition, when a ground voltage is applied to source electrode 33 and a negative voltage is applied to drain electrode 22, leak failure between gate metal wiring 31 and drain electrode 22 can be suppressed.

Since inorganic protective film 1e having good adhesion to the metal material is provided on source electrode 33, entry of ions in a mold resin and moisture from an interface between source electrode 33 and inorganic protective film 1e can be suppressed in a reliability test in a high temperature and high humidity atmosphere, such as a THB test. Since entry of ions in the mold resin and moisture from the interface between source electrode 33 and inorganic protective film 1e is prevented, separation in an interface between gate metal wiring 31 and inorganic protective film 1f can be suppressed and leak failure between gate metal wiring 31 and source electrode 33 and between gate metal wiring 31 and drain electrode 22 can be suppressed.

Further, since inorganic protective film 1g is formed on channel stopper electrode 32, entry of ions in the mold resin and moisture from an end surface of element peripheral portion Y can be prevented in a reliability test in a high temperature and high humidity atmosphere, such as a THB test.

Since inorganic protective films 1e, 1f and 1g are formed only on the upper and side surfaces of source electrode 33, the side and upper surfaces of gate metal wiring 31 and the side and upper surfaces of the channel stopper electrode, it is possible to prevent cracks which occurred in inorganic protective film 10 in element peripheral portion Y in the technique shown in FIG. 14 due to the stress applied to semiconductor device 101 in a fabricating step.

Since these cracks are prevented, ions in the mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

Embodiment 5

Figure 9:
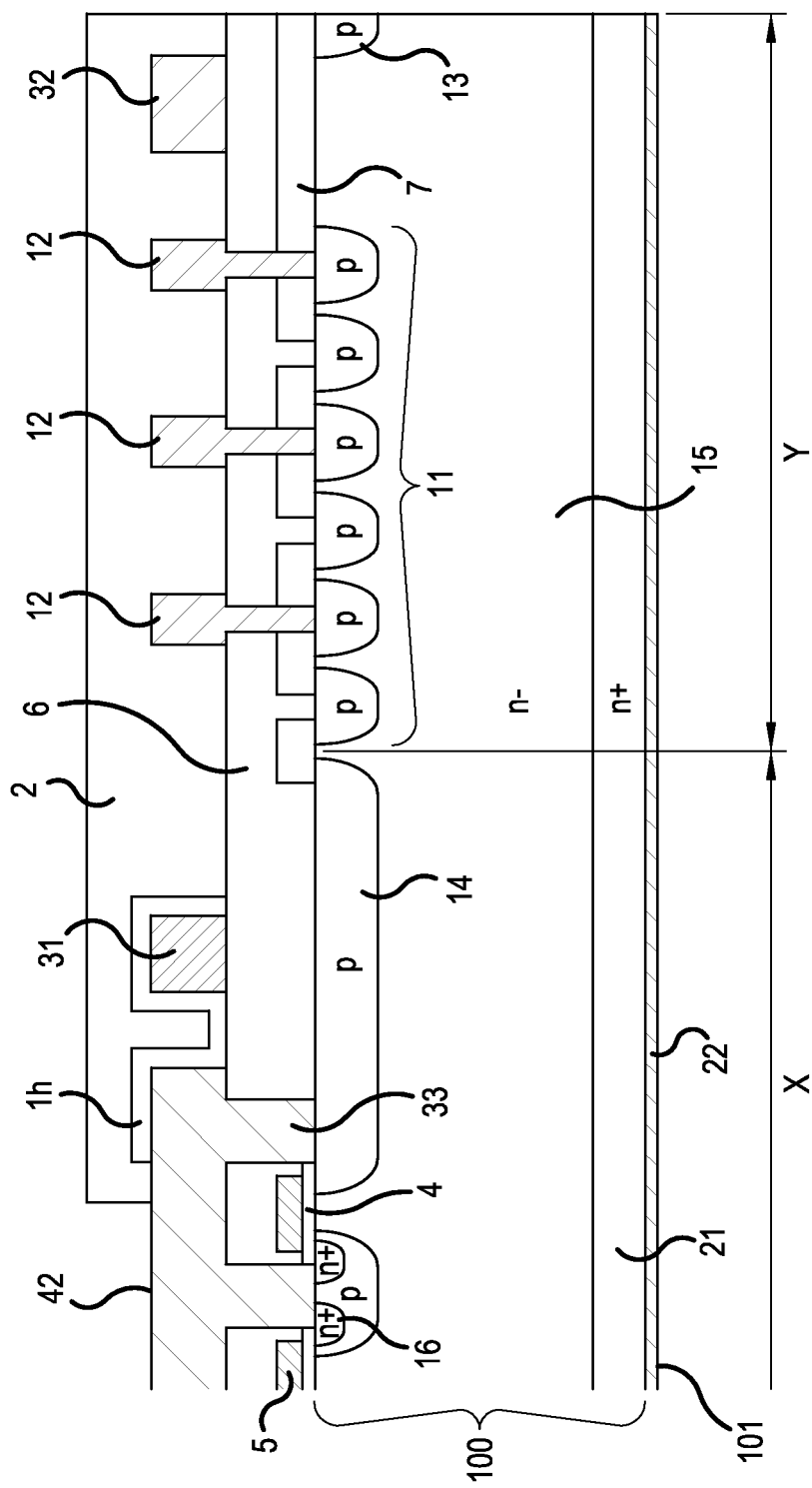
FIG. 9 is a sectional view of Embodiment 5 of the invention taken along the line A-A' in FIG. 1.

FIG. 9 is a configuration view of a fifth embodiment of the invention, which is a sectional view taken along line A-A' in FIG. 1.

The different point from the first embodiment is that inorganic protective film 1h is provided consecutively from between source electrode 33 and organic protective film 2 to gate metal wiring 31. The remaining configuration is the same as that in the first embodiment.

As shown in FIG. 9, inorganic protective film 1h is formed consecutively from an opening end of source electrode 33 to element peripheral portion Y-side end portion of gate metal wiring 31. Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Incidentally, an end portion of inorganic protective film 1h and an end portion of organic protective film 2 in gate electrode pad 41 and source electrode pad 42 may be formed so that an end surface of inorganic protective film 1h and an end surface of organic protective film 2 are put in plane with each other as shown in FIG. 6B.

Inorganic protective film 1h is of a silicon oxide film or a silicon nitride film having good adhesion to the metal material. Inorganic protective film 1h is formed to be thick enough to cover electrodes made of the metal material for gate metal wiring 31, channel stopper electrode 32, source electrode 33, source electrode pad 42 and field plate electrodes 12. Therefore, when, for example, the electrodes made of the metal material are 3 to 5 μm thick, it is preferable that inorganic protective film 1h is formed to be about 0.5 to 1.0 μm thick.

Inorganic protective film 1h is formed in such a manner that an inorganic protective film is formed on the whole of the first main surface of semiconductor substrate 100 by a CVD method, patterned with a resist and then dry-etched so as to be removed except a surface which is consecutive to range from an opening end of source electrode 33 to element peripheral portion Y side end portion of gate metal wiring 31.

Since the surface which is consecutive to range from the opening end of source electrode 33 to element peripheral portion Y side end portion of gate metal wiring 31 is covered with the inorganic protective film 1h having good adhesion to the metal material, entry of ions in a mold resin and moisture from an interface between source electrode 33 and inorganic protective film 1h can be prevented in a reliability test in a high temperature and high humidity atmosphere, such as a THB test, so that separation in an interface between gate metal wiring 31 and inorganic protective film 1h can be suppressed and leak failure between gate metal wiring 31 and source electrode 33 can be suppressed. In addition, when a negative voltage is applied to drain electrode 22, leak failure between gate metal wiring 31 and drain electrode 22 can be suppressed.

Since inorganic protective film 1h is provided only in the portion ranging from the opening end of source electrode 33 to element peripheral portion Y side end portion of gate metal wiring 31, it is possible to prevent cracks which occurred in inorganic protective film 10 in element peripheral portion Y in the technique shown in FIG. 14 due to the stress applied to semiconductor device 101 in a fabricating step. Since these cracks are prevented, ions in the mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

Embodiment 6

Figure 10:
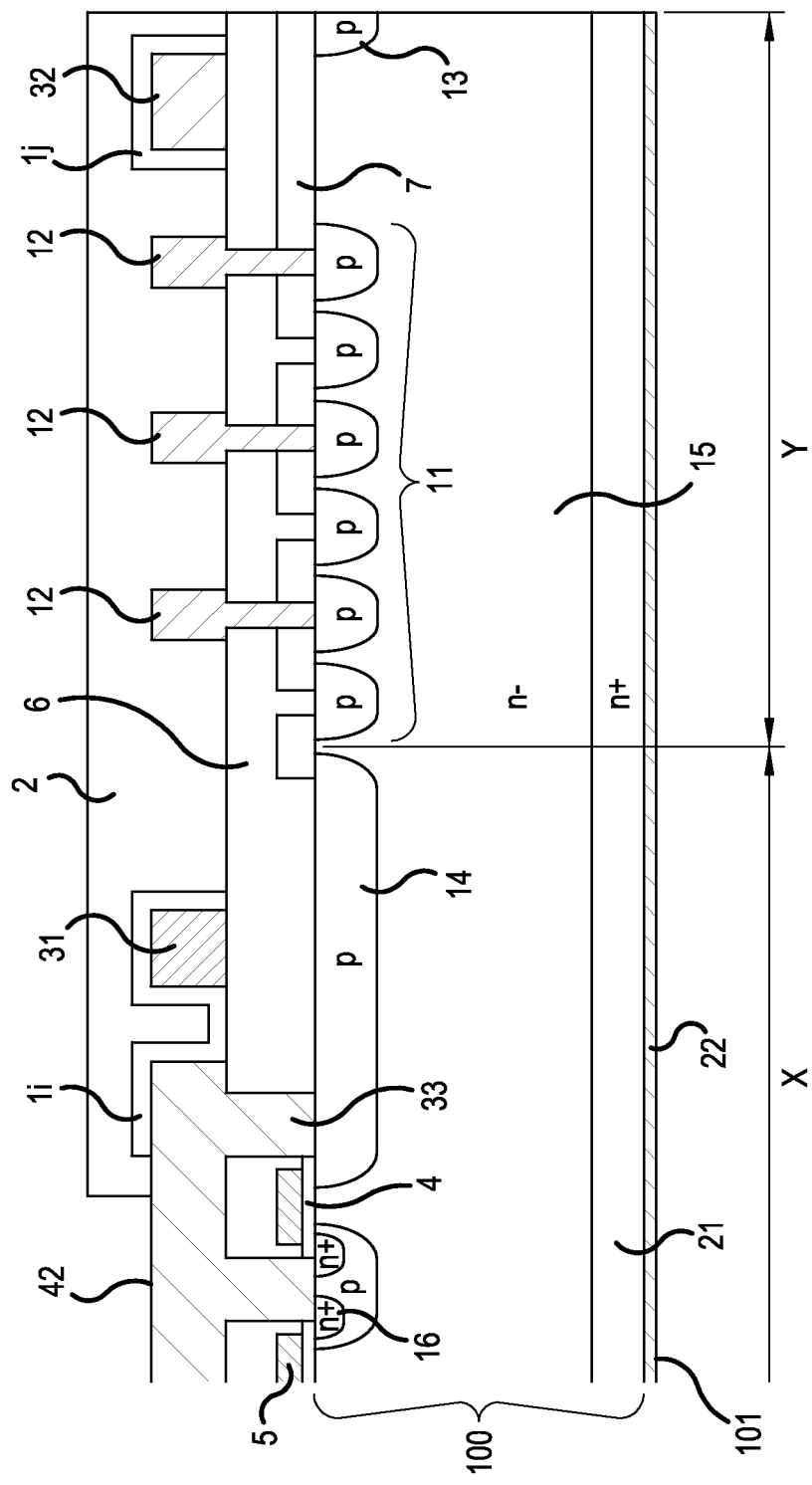
FIG. 10 is a sectional view of Embodiment 6 of the invention taken along the line A-A' in FIG. 1.

FIG. 10 is a configuration view of a sixth embodiment of the invention, which is a sectional view taken along line A-A' in FIG. 1.

The different point from the fifth embodiment is that inorganic protective film 1j is further provided between channel stopper electrode 32 and organic protective film 2. The remaining configuration is the same as that in the fifth embodiment.

As shown in FIG. 10, inorganic protective film 1i is formed consecutively to range from an opening end of source electrode 33 to element peripheral portion Y side end portion of gate metal wiring 31 over gate metal wiring 31 and inorganic protective film 1j is formed also on the side and upper surfaces of channel stopper electrode 32. Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Inorganic protective films 1i and 1j are of a silicon oxide film or a silicon nitride film having good adhesion to the metal material. Inorganic protective films 1i and 1j are formed to be thick enough to cover electrodes made of the metal material for gate metal wiring 31, channel stopper electrode 32, source electrode 33, source electrode pad 42 and field plate electrodes 12. Therefore, when, for example, the electrodes made of the metal material are 3 to 5 μm thick, it is preferable that inorganic protective films 1i and 1j are formed to be about 0.5 to 1.0 μm thick.

Inorganic protective films 1i and 1j are formed in such a manner that an inorganic protective film is formed on the whole of the first main surface of semiconductor substrate 100 by a CVD method, patterned with a resist and then dry-etched so as to be removed except a surface which is consecutive to range from the opening end of source electrode 33 to element peripheral portion Y side end portion of gate metal wiring 31 and the side and upper surfaces of channel stopper electrodes 32.

Since the surface which is consecutive to range from the opening end of source electrode 33 to element peripheral portion Y side end portion of gate metal wiring 31 is covered with inorganic protective film 1i having good adhesion to the metal material, entry of ions in a mold resin and moisture from an interface between source electrode 33 and inorganic protective film 1*i* can be prevented in a reliability test in a high temperature and high humidity atmosphere, such as a THB test. Thus, separation in an interface between gate metal wiring 31 and inorganic protective film 1*i* can be suppressed and leak failure between gate metal wiring 31 and source electrode 33 can be suppressed. In addition, when a ground voltage is applied to source electrode 33 and a negative voltage is applied to drain electrode 22, leak failure between gate metal wiring 31 and drain electrode 22 can be suppressed.

Further, since inorganic protective film 1*j* is formed on the side and upper surfaces of channel stopper electrode 32, entry of ions in the mold resin and moisture from an end surface of the element peripheral portion Y can be prevented in a reliability test in a high temperature and high humidity atmosphere, such as a THB test.

Since an inorganic protective film is formed only into inorganic protective film 1*i* which is formed consecutively to range from the opening end of source electrode 33 to element peripheral portion Y side end portion of gate metal wiring 31 and inorganic protective film 1*j* which is formed on element active portion X-side side surface and the upper surface of channel stopper electrode 32, it is possible to prevent cracks which occurred in inorganic protective film 10 in element peripheral portion Y in the technique shown in FIG. 14 due to the stress applied to semiconductor device 101 in a fabricating step. Since these cracks are prevented, ions in the mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

Embodiment 7

Figure 11:
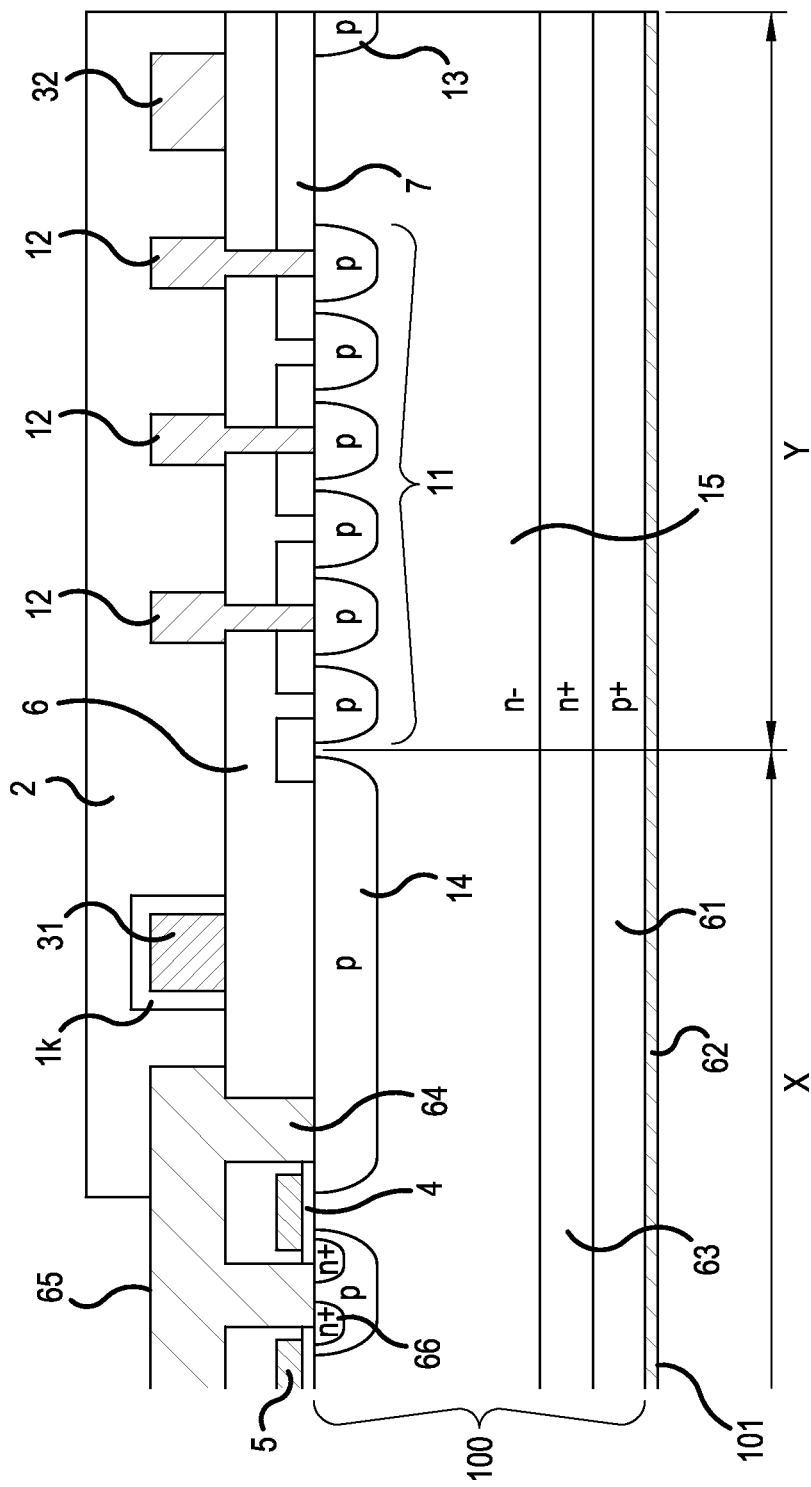
FIG. 11 is a sectional view of Embodiment 7 of the invention taken along the line A-A' in FIG. 1.

FIG. 11 is a configuration view of a seventh embodiment of the invention, which is a sectional view taken along line A-A' in FIG. 1.

The different point from the first embodiment is that the semiconductor device is provided as an IGBT having collector region 61 provided on the second main surface side of semiconductor substrate 100. The remaining configuration is the same as that in the first embodiment.

As shown in FIG. 11, inorganic protective film 1*k* is formed on the side and upper surfaces of gate metal wiring 31, and organic protective film 2 is formed on the first main surface side upper surface of semiconductor substrate 100 except gate electrode pad 41 and emitter electrode pad 65 which are formed by exposing a part of gate metal wiring 31 and a part of emitter electrode 64.

Buffer region 63 is formed on the second main surface side of semiconductor substrate 100 and collector region 61 is formed on an upper surface of buffer region 63. Further, collector electrode 62 is formed on collector region 61.

Inorganic protective film 1*k* is of a silicon oxide film or a silicon nitride film having good adhesion to the metal material. Inorganic protective film 1*k* is formed to be thick enough to cover an electrode made of the metal material for gate metal wiring 31, channel stopper electrode 32, source electrode 33, source electrode pad 42 and field plate electrodes 12. Therefore, when, for example, the electrode made of the metal material is 3 to 5 μm thick, it is preferable that inorganic protective film 1*k* is formed to be about 0.5 to 1.0 μm thick.

Inorganic protective film 1*k* is formed in such a manner that an inorganic protective film is formed on the whole of the first main surface of semiconductor substrate 100 by a CVD method, patterned with a resist and then dry-etched so as to be removed except the side and upper surfaces of gate metal wiring 31.

Since the side and upper surfaces of gate metal wiring 31 are covered with inorganic protective film 1*k* having good adhesion to the metal material, separation in an interface between gate metal wiring 31 and inorganic protective film 1*k* can be suppressed in a reliability test in a high temperature and high humidity atmosphere, such as a THB test, so that leak failure between gate metal wiring 31 and emitter electrode 64 can be suppressed.

Incidentally, in the case where a ground voltage is applied to emitter electrode 64 and a negative voltage is applied to collector electrode 62, occurrence of leak failure between gate metal wiring 31 and collector electrode 62 can be prevented.

Since inorganic protective film 1*k* is provided only on the side and upper surfaces of gate metal wiring 31, it is possible to prevent cracks which occurred in inorganic protective film 10 in element peripheral portion Y in the technique shown in FIG. 14 due to the stress applied to semiconductor device 101 in a fabricating step. Since these cracks are prevented, ions in a mold resin and moisture can be prevented from locally entering into a crack occurrence place in a reliability test in a high temperature and high humidity atmosphere, such as a THB test, so that the withstand voltage can be suppressed from being locally decreased between collector electrode 62 and emitter electrode 64 and leak failure can be suppressed.

The IGBT structure shown in FIG. 11 can be also applied to Embodiments 1 to 6.

Embodiment 8

Figure 12:
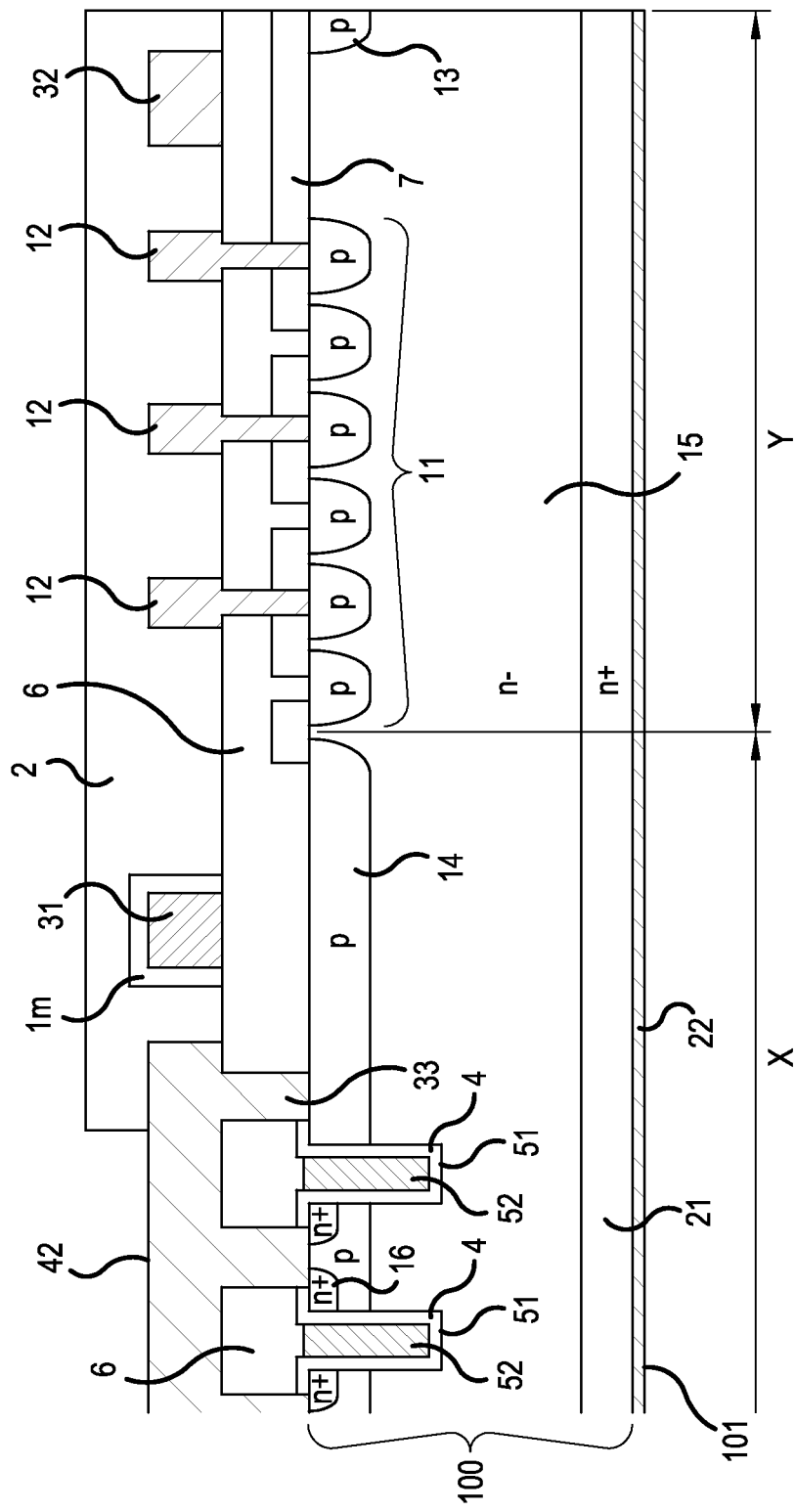
FIG. 12 is a sectional view of Embodiment 8 of the invention taken along the line A-A' in FIG. 1.

FIG. 12 is a configuration view of an eighth embodiment of the invention, which is a sectional view taken along line A-A' in FIG. 1.

The different point from the first embodiment is that element active portion X is provided as a trench structure. The remaining configuration is similar to that in the first embodiment.

As shown in FIG. 12, p base region 14 is formed in first conductive type drift region 15 in the first main surface of semiconductor substrate 100 in element active portion X, and trenches 51 extended to drift region 15 from the surface of semiconductor substrate 100 are formed. Gate electrode 52 is embedded into each of trenches 51 through gate insulating film 4. Gate electrode 52 is made of polycrystal silicon doped with impurities. Gate electrode 52 is covered with interlayer insulating film 6. N-type source region 16 is formed adjacently to each of trenches 51, and source electrode 33 is connected to n-type source region 16 and p base region 14.

Inorganic protective film 1*m* is formed on the side and upper surfaces of gate metal wiring 31. Organic protective film 2 is formed on the first main surface side upper surface of semiconductor substrate 100 except gate electrode pad 41 and source electrode pad 42 which are formed by exposing a part of gate metal wiring 31 and a part of source electrode 33.

Inorganic protective film 1*m* is of a silicon oxide film or a silicon nitride film having good adhesion to the metal material. Inorganic protective film 1*m* is formed to be thick enough to cover an electrode made of the metal material for gate metal wiring 31, channel stopper electrode 32, source electrode 33, source electrode pad 42 and field plate electrodes 12. Therefore, when, for example, the electrode made of the metal material is 3 to 5 μm thick, it is preferable that inorganic protective film 1*m* is formed to be about 0.5 to 1.0 μm thick.

Inorganic protective film 1m is formed in such a manner that an inorganic protective film is formed on the whole of the first main surface of semiconductor substrate 100 by a CVD method, patterned with a resist and then dry-etched so as to be removed except the side and upper surfaces of gate metal wiring 31.

Since the side and upper surfaces of gate metal wiring 31 are covered with inorganic protective film 1m having good adhesion to the metal material, separation in an interface between gate metal wiring 31 and inorganic protective film 1m can be suppressed in a reliability test in a high temperature and high humidity atmosphere, such as a THB test, so that leak failure between gate metal wiring 31 and source electrode 33 can be suppressed. In addition, in the case where a ground voltage is applied to source electrode 33 and a negative voltage is applied to drain electrode 22, leak failure between gate metal wiring 31 and drain electrode 22 can be suppressed.

Since inorganic protective film 1m is formed only on the side and upper surfaces of gate metal wiring 31, it is possible to prevent cracks which occurred in inorganic protective film 10 in element peripheral portion Y in the technique shown in FIG. 14 due to the stress applied to semiconductor device 101 in a fabricating step. Since these cracks are prevented, ions in a mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

The trench structure shown in FIG. 12 can be applied to Embodiments 1 to 7 so that similar effects can be obtained.

Embodiment 9

Figure 13:
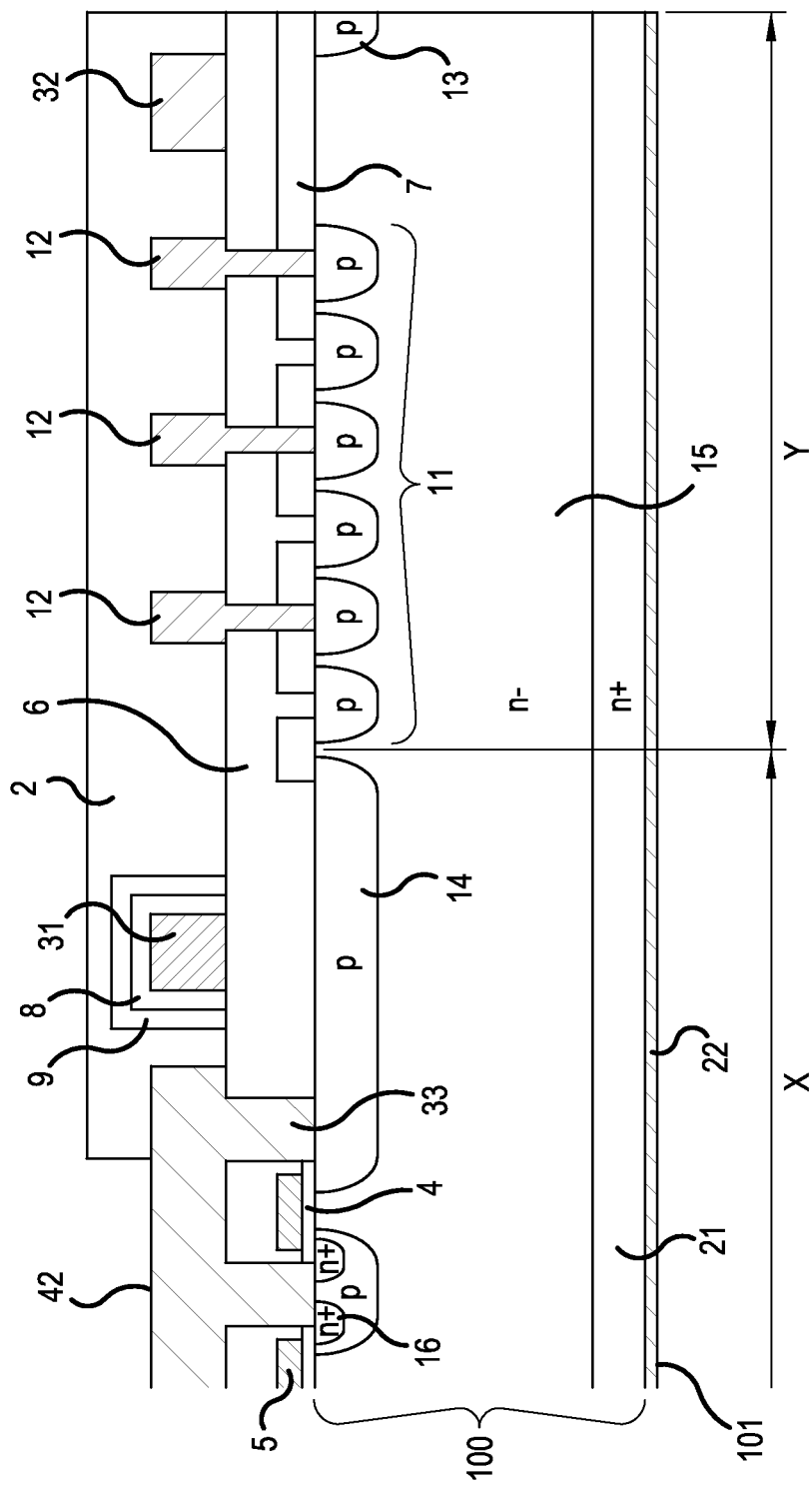
FIG. 13 is a sectional view of Embodiment 9 of the invention taken along the line A-A' in FIG. 1.

FIG. 13 is a configuration view of a ninth embodiment of the invention, which is a sectional view taken along line A-A' in FIG. 1.

The different point from the first embodiment is that an inorganic protective film for covering gate metal wiring 31 is formed as a laminated film. The remaining configuration is similar to that in the first embodiment.

As shown in FIG. 13, first inorganic protective film 8 is formed on the side and upper surfaces of gate metal wiring 31, second inorganic protective film 9 is formed on an upper surface of first inorganic protective film 8, and organic protective film 2 is formed on the first main surface side upper surface of semiconductor substrate 100 except gate electrode pad 41 and source electrode pad 42 which are formed by exposing a part of gate metal wiring 31 and a part of source electrode 33.

First inorganic protective film 8 is of a silicon oxide film having good adhesion to the metal material. First inorganic protective film 8 is formed to be thick enough to cover an electrode made of the metal material for gate metal wiring 31, the channel stopper electrode 32, source electrode 33, source electrode pad 42 and field plate electrodes 12. Therefore, when, for example, the electrode made of the metal material is 3 to 5 μm thick, it is preferable that first inorganic protective film 8 is formed to be about 0.5 to 1.0 μm thick.

Second inorganic protective film 9 is of a silicon nitride film in order to suppress entry of moisture. Second inorganic protective film 9 is formed to be thick enough to cover the electrode made of the metal material for gate metal wiring 31, channel stopper electrode 32, source electrode 33, source electrode pad 42 and field plate electrodes 12. Therefore, when, for example, the electrode made of the metal material is 3 to 5 μm thick, it is preferable that second inorganic protective film 9 is formed to be about 0.5 to 1.0 μm thick.

First inorganic protective film 8 and second inorganic protective film 9 are formed in such a manner that a first inorganic protective film is formed on the whole of the first main surface of semiconductor substrate 100 by a CVD method and a second inorganic protective film is formed on the first organic protective film by a CVD method so that the first inorganic protective film and the second inorganic protective film are patterned with a resist and then dry-etched so as to be removed except the side and upper surfaces of gate metal wiring 31.

Since the side and upper surfaces of gate metal wiring 31 are covered with first inorganic protective film 8 having good adhesion to the metal material, separation in an interface between gate metal wiring 31 and inorganic protective film 8 can be suppressed in a reliability test in a high temperature and high humidity atmosphere, such as a THB test, so that leak failure between gate metal wiring 31 and source electrode 33 can be suppressed. In addition, in the case where a negative voltage is applied to drain electrode 22, leak failure between gate metal wiring 31 and drain electrode 22 can be suppressed.

Further, since an upper surface of first inorganic protective film 8 is covered with second inorganic protective film 9, entry of moisture into first inorganic protective film 8 can be suppressed.

Since first inorganic protective film 8 and second inorganic protective film 9 are formed only on the side and upper surfaces of gate metal wiring 31, it is possible to prevent cracks which occurred in inorganic protective film 10 in element peripheral portion Y in the technique shown in FIG. 14 due to the stress applied to semiconductor device 101 in a fabricating step. Since these cracks are prevented, ions in a mold resin and moisture can be prevented from locally entering into a crack occurrence place in a reliability test in a high temperature and high humidity atmosphere, such as a THB test, so that the withstand voltage can be suppressed from being locally decreased between drain electrode 22 and source electrode 33 and leak failure can be suppressed.

An inorganic protective film formed as a laminated film in which a silicon nitride film is formed on the upper surface of a silicon oxide film as shown in FIG. 13 can be applied to Embodiments 1 to 8.

Incidentally, although first inorganic protective film 8 is formed as a silicon oxide film and second inorganic protective film 9 is formed as a silicon nitride film in the embodiment, first inorganic protective film 8 may be formed as a silicon nitride film and second inorganic protective film 9 may be formed as a silicon oxide film.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device comprising an element active portion and an element peripheral portion provided in an outer periphery than the element active portion, wherein
(i) the element active portion comprises:
a second conductive type base region which is formed in a first conductive type semiconductor layer on a first main surface side of a semiconductor substrate;
a first conductive type source region which is formed in the base region;

a gate insulating film which is formed on the surface of the semiconductor substrate in the base region between the semiconductor layer and the source region;

a gate electrode which is formed on the gate insulating film;

an interlayer insulating film which is formed on the gate electrode;

a source electrode which is formed on the interlayer insulating film and connected to the base region and the source region; and an annular gate metal wiring which is formed on the interlayer insulating film so as to surround the source electrode and which is electrically connected to the gate electrode; and (ii) the element peripheral portion comprises:

at least two guard rings of the second conductive type which are separately formed in the semiconductor layer an insulating layer which is formed on the first main surface of the semiconductor substrate;

the interlayer insulating film which is formed on the insulating film;

at least one annular field plate electrode which is formed on the interlayer insulating layer so as to surround the element active portion and which is electrically connected to the guide rings;

an organic protective film with which the first main surface side upper surface of the semiconductor substrate is covered, and which is in contact with the interlayer insulating layer while having a first opening portion partially exposing the gate metal wiring and a second opening portion partially exposing the source electrode; and an inorganic protective film which is formed between the gate metal wiring and the organic protective film so as to cover the gate metal wiring.

2. A semiconductor device according to claim 1, wherein the inorganic protective film is not formed in an outer periphery than the inorganic protective film formed on a side surface of the gate metal wiring in the element peripheral portion side.

3. A semiconductor device according to claim 1, wherein the inorganic protective film is not formed between the inorganic protective film formed on a side surface of the gate metal wiring in the element peripheral portion side and a side surface of the field plate electrode in an outermost periphery of the element peripheral portion;

a second conductive type region formed in a surface layer of the semiconductor layer and an annular channel stopper electrode formed on the interlayer insulating film so as to be electrically connected to the semiconductor layer or the second conductive type region are formed in the outermost periphery of the element peripheral portion; and a second inorganic protective film is provided between the channel stopper electrode and the organic protective film.

4. A semiconductor device according to claim 1, wherein a third inorganic protective film is provided between the source electrode and the organic protective film.

5. A semiconductor device according to claim 1, wherein the inorganic protective film is provided between the source electrode and the organic protective film, between the interlayer insulating film and the organic protective film and between the gate metal wiring and the organic protective film so as to be consecutive in the range of from an opening end of the source electrode to an end portion of the gate metal wiring on the element peripheral portion side.

6. A semiconductor device according to claim 1, wherein a gate electrode pad partially exposing the gate metal wiring is provided in the first opening portion and a source electrode pad partially exposing the source electrode is provided in the second opening portion.

7. A semiconductor device according to claim 1, wherein the inorganic protective film is made of one selected from a silicon oxide film and a silicon nitride film.

8. A semiconductor device according to claim 1, wherein the inorganic protective film consists of a laminated film.

9. A semiconductor device according to claim 1, wherein the organic protective film is made of one selected from polybenzoxazole and polyimide.

10. A semiconductor device according to claim 1, wherein the gate metal wiring is made of an alloy containing aluminum.

* * * * *